(12) United States Patent
Mallet et al.

(10) Patent No.: US 6,820,043 B2
(45) Date of Patent: Nov. 16, 2004

(54) MODELING CONTINUOUS PROPERTIES ON DISCONTINUOUS SURFACES

(75) Inventors: Jean-Laurent Mallet, Nancy (FR); Richard Cognot, Nancy (FR); T. Ait Ettajer, United Arab Emirates (FR)

(73) Assignee: T-Surf Corporation, Houston, TX (US)

( * ) Notice: Subject to any disclaimer, the term of this patent is extended or adjusted under 35 U.S.C. 154(b) by 572 days.

(21) Appl. No.: 09/927,417

(22) Filed: Aug. 9, 2001

(65) Prior Publication Data

US 2002/0198692 A1 Dec. 26, 2002

Related U.S. Application Data

(63) Continuation-in-part of application No. 09/184,781, filed on Nov. 2, 1998, now abandoned.

(51) Int. Cl.[7] .......................... G06F 17/10; G06T 17/00
(52) U.S. Cl. ............................................ 703/2; 345/606
(58) Field of Search ........................ 703/1, 2; 345/419, 345/420, 421, 423, 428, 442, 581, 606; 382/242, 173

(56) References Cited

U.S. PATENT DOCUMENTS

| | | | | |
|---|---|---|---|---|
| 5,465,323 | A | | 11/1995 | Mallet ......................... 395/123 |
| 5,537,494 | A | * | 7/1996 | Toh ............................. 382/242 |
| 5,631,975 | A | * | 5/1997 | Riglet et al. ................ 382/173 |
| 5,844,564 | A | * | 12/1998 | Bennis et al. ............... 345/423 |
| 6,300,958 | B1 | * | 10/2001 | Mallet ......................... 345/442 |

OTHER PUBLICATIONS

Han et al., Triangular NURBS Surface Modeling of Scattered Data, IEEE Proceedings, Visualization '96, Nov. 1996, pp. 295–302.*
Guy et al., Inference of Surfaces, 3D Curves, and Junctions from Sparse, Noisy 3D Data, IEEE Transactions on Pattern Analysis and Machine Intelligence, vol. 19, No. 11, Nov. 1997, pp. 1265–1277.*
Lee et al., Inferring Segmented Surface Description from Stereo Data, Proceedings IEEE Computer Society Conference on Computer Vision and Pattern Recognition, Jun. 1998, pp. 346–352.*
Liu et al., Spatial Discontinuity Detection and Temporal Smoothing for Heart–Wall Motion Estimation from TM–Mode Echocardiographic Images, IEEE, Computers in Cardiology, Sep. 1995, pp. 561–564.*
Cohen et al., Ordering and Parameterizing Scattered 3D Data for B–Spline Surface Approximation, IEEE Transactions on Pattern Analysis and Machine Intelligence, vol. 22, No. 6, Jun. 2000, pp. 642–648.*
Silvetti et al., T–Splines: A New Schema for C2 Spline Interpolation, XVII International Conference of the Chilean Computer Science Society, IEEE, Nov. 1997, pp. 240–245.*
Chang et al., An Interpolatory Subdivision for Volumetric Models over Simplicial Complexes, IEEE, Shape Modeling International, May 2003, pp. 143–152.*
Garland et al., "Simlifying Surfaces with Color and Texture Using Quadratic Error Metrics", Proc. Conference on Visualization, pp. 263–269, Oct. 1998.*

* cited by examiner

*Primary Examiner*—Russell Frejd
(74) *Attorney, Agent, or Firm*—Reidlaw, L.L.C.; John S. Reid (57) ABSTRACT

A method of establishing continuity of a property which is interpolated over a surface defined by at least two primary nodes. The method includes identifying first and second portions of a boundary which defines a discontinuity in the surface. The method further includes defining the first and second portions of the boundary by at least one secondary node on each portion, and interpolating the property from a first primary node to a second primary node by utilizing the secondary nodes. When the property is characterized by determined values at primary nodes on the surface, the continuity of the property can be established as substantially the same value of the property at the selected secondary nodes. When the surface is characterized by a given gradient at each of the secondary nodes, the continuity of the property can be established as substantially the same gradient at the selected secondary nodes.

35 Claims, 7 Drawing Sheets

MODELING CONTINUOUS PROPERTIES ON DISCONTINUOUS SURFACES

CROSS REFERENCE TO RELATED APPLICATIONS

This application is a continuation-in-part of co-pending U.S. patent application Ser. No. 09/184,781, filed Nov. 2, 1998, now abandoned, and entitled, "Modeling Continuous Properties On Discontinuous Surfaces".

FIELD OF INVENTION

This invention pertains to the field of topology, and more particularly to a method for restoring the continuity of a property interpolated over a modeled surface across discontinuities that can affect this surface.

BACKGROUND OF THE INVENTION

One method in the prior art for modeling a two dimensional surface which varies in a third dimension is to generate a topological surface composed of a plurality of triangles having apexes connected at nodes. The surfaces themselves are modeled as piece-wise continuous sets of triangles. Such a surface is commonly termed a triangulated surface. In modeling such surfaces, the surface typically has a property applied to or mapped to the surface. The property can be as simple as the variation of nodes of the triangles from an initial reference point, or variation from the adjacent node. Alternately, the surface can be described by a physical property along the surface, such as temperature. Typically, both the geometry and the properties are discrete, and are stored only at the node locations.

Examples of surfaces which can be modeled in this way are a contoured surface such as a body panel for a vehicle; interfaces between geological strata, interfaces between organic tissue; and even the surface of an animated figure, to name but a few. Often such surfaces have discontinuities. For example, a body panel for a vehicle can have an opening for a fuel fill nozzle, or a geological strata can be separated along a fault line. In modeling such surfaces, it is desirable that the property modeled across such discontinuities in the surface be modeled such that the property accurately fits the surface.

Figure 1:
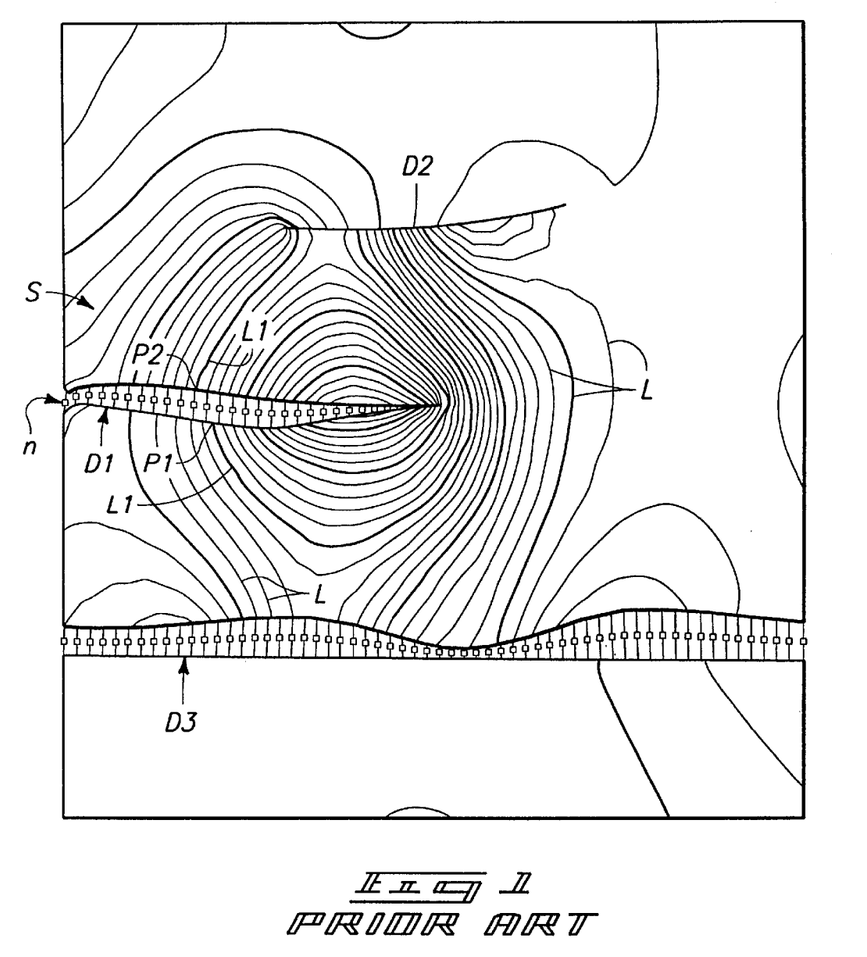
FIG. 1 depicts a surface having a property interpolated over discontinuities in the surface using prior art methods.

Current methods for modeling a property across a discontinuity in a surface, such as a triangluated surface, produce results which are not typically representative of the property. For example, a linear interpolation is assumed to establish the geometry and properties inside each triangle. However, current methods for interpolating properties on such a surface leads to a clearly discontinuous result. Referring now to FIG. 1, a diagram showing a property interpolated over a discontinuous surface S having discontinuities D1, D2 and D3 is shown. The property depicted is interpolated using prior art methods. The property, displayed here as contour lines L, is also discontinuous, as can be seen at points P1 and P2 wherein the line L1 does not smoothly interpolate across the discontinuity D1. Further, the lines inside discontinuities D1 and D3 represent the directions along which it is preferred to reconcile the two sides of the discontinuity when interpolating this property.

It is therefore desirable to have a method for smoothly interpolating a property across a discontinuity in a modeled surface, especially in a triangulated surface.

SUMMARY OF THE INVENTION

The present invention includes a method for restoring the continuity of a property interpolated over a surface and across discontinuities that can affect the same surface.

One aspect of the present invention includes a method of establishing a continuity of a property which is interpolated over a surface. In this regard the method includes the steps of identifying first and second portions of a boundary which defines a discontinuity in the surface, the surface defined by at least two primary nodes; defining the first and second portions of the boundary by at least one secondary node on each portion; and interpolating the property from a first primary node to a second primary node by utilizing the secondary nodes.

Another aspect of the present invention relates to a method for modeling a value of a property across a discontinuity which is defined in a surface. The method comprises the steps of defining the surface and first and second portions of a boundary of a discontinuity by a plurality of primary nodes; assigning a secondary node to each of the first and second portions of the boundary; and interpolating the value of the property across the boundary from a first primary node to a second primary node while maintaining a predetermined continuity between the corresponding secondary nodes.

A further aspect of the present invention includes a method of establishing a continuity of a property which is interpolated over a surface. The method comprises the following sequential steps: first, identifying first and second portions of a boundary which defines a discontinuity in the surface, the surface defined by at lest two primary nodes. Following identifying the first and second portions of the boundary, the method comprises the step of defining the first and second portions of the boundary by at least one secondary node on each portion of the boundary. Following the step of defining the first and second portions of the boundary by at least one secondary node on each portion, the method further comprises the step of substantially simultaneously interpolating the property from a first primary node to a second primary node by utilizing the secondary nodes.

An additional aspect of the present invention includes a method of calculating values for a property to be mapped onto a surface to provide a continuity of values of the property across a discontinuity which is defined by the surface. The method comprises topologically defining the surface by a plurality of primary nodes which are mathematically associated with one another to provide a plurality of triangles having apexes at the primary nodes and triangle edges connected the primary nodes. Thereafter, the method comprises identifying first and second boundaries which define the discontinuity in the surface, the boundaries comprising triangle edges and identifying selected primary nodes which are on the first and second boundaries of the discontinuity. The method also comprises segmenting the boundaries of the discontinuity into an equal number of segments, and identifying locations of segments along the triangle edges which comprise the first and second boundaries of the discontinuity. In this step, a first value of the property is calculated for a first primary node of the second continuity, and a second value of the property is calculated for a second primary node on the first boundary of the discontinuity. The method also comprises linearly interpolating a third value of the property at the location of a segment on the first boundary as a function of the distance of the segment from the first primary node, and also as a function of the first and second values of the property at the respective first and second primary nodes. The third value of the property at the location of the segment on the first boundary is assigned to the corresponding location of the segment on the second boundary. The method further comprises a step of calculating a fourth value of the property at a third primary node on the second boundary as a function of the distance of the third primary node from the location of the segment on the second boundary and as a function of the third value of the property.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 3:
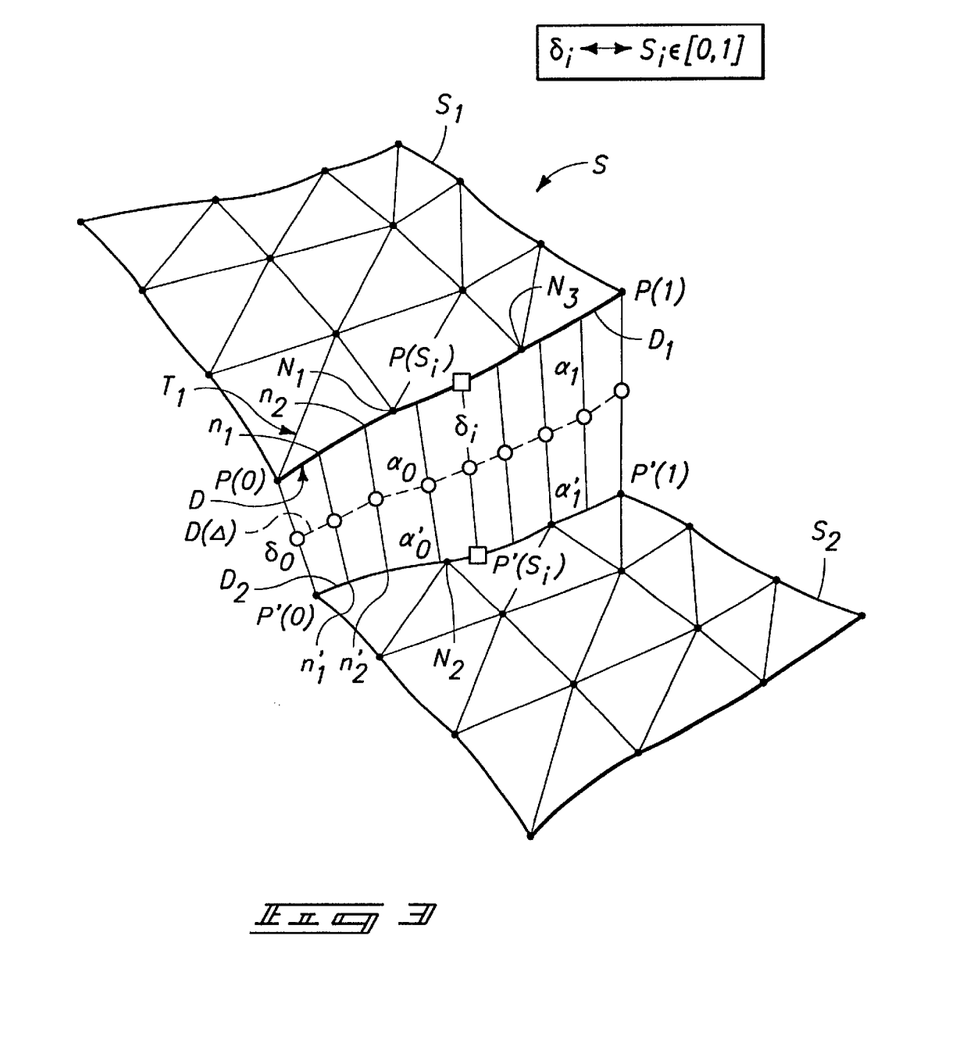
FIG. 3 depicts a step in the method of the present invention of linking the two sides of a discontinuity.

The invention includes a method of establishing a continuity of a property which is interpolated over a surface. A property is typically represented by a function $\phi$. Such a surface "S" is shown in FIG. 3 as combined surface portions S1 and S2. The surface depicted in FIG. 3 can represent any modeled surface, such as a model of a real surface wherein the model is based on data acquired from measuring the real surface. For example, the model surface "S" can be a model of a layer in a geological formation which is based on real data collected via seismology. The modeled surface "S" can also be a model of a surface generated by "synthetic" data (i.e., data created to produce the model). An example of this letter type of modeled surface can portions of the body panels of an automobile which are computer generated using computer aided design ("CAD") software. For example, surfaces S1 and S2 can be models of portions of surfaces of an automobile hood, the two surfaces being separated by an air induction inlet. As another example, the surface can be a representation of a computer generated image, such as a landscape or a person, and the property can be lighting or shading of light on the surface. Consequently, the property which is modeled onto the surface can be a property related to the surface. For example, if the surface is representative of a subsurface geological layer, then the property can be permeability, pressure, or porosity. The property can be variable across the surface, and is defined by the function $\phi$, as describe above.

The surface is generally represented by a "surface data set" which comprises data values representative of nodes which collectively and spatially represent the surface. In the initial data set (before being modified by the method disclosed below), the nodes are "primary nodes". The data set can also include mathematical representations of the function which is applied over the surface.

Accordingly, the first step in the method of the present invention to provide a data set which comprises a model of the surface (i.e., a "surface model"), the surface having a discontinuity. The data set can be stored on a computer-readable memory device, such as a magnetic tape, a compact disk, a hard drive, or a microchip, for example. The data set can thus be retried, for example, by a computer processor, and the method implemented using a computer. The method also include obtaining a function $\phi$ which represents the variation of a property at points along the continuous surface. The surface S is defined by interconnecting a collection of primary nodes, which are those points indicated by the small, dark circles at the corners of the triangulated segments depicted in FIG. 3. The surface model can either be generated from a data real data set or a synthetic data set, as described above. The model can be obtained using any number of known software programs for creating models of surfaces from a collection of data which are representative of the topology of the surface. The method includes a step of identifying a first portion D1 and a second portion D2 of a discontinuity D in the surface S. More specifically, the method can include the step of identifying those values (or selected ones of those values) in the surface data set which are representative of the portions of the discontinuity. The surface S is defined by at least two primary nodes N1 and N2 in the surface model. The method includes a step of defining the first portion D1 by at least one secondary node $\alpha i$ and defining the second portion D2 of the boundary by another secondary node $\alpha'1$. This step can be accomplished by generating data values which represent the secondary nodes, and positioned as described further below. The property $\phi$ is interpolated from a first primary node $N_1$ on a first segment of the surface $S_1$ to a second primary node $N_2$ on the surface $S_2$ by utilizing the secondary nodes $n_1$ and $n_2$. The step of interpolating the property can be performed using a computer. After interpolation, the surface data set is a modified data set, representing the property as now applied over the surface. The data set can either be stored on a computer-readable memory device, or displayed, or printed. The step of displaying the modified data set can be accomplished by displaying it on a screen, such as a computer monitor or a projection screen on in a holographic projection, or by printing a copy of an image of the surface having the property applied thereto.

In the present invention, the step of interpolating the property from the first primary node N1 to the second primary node N2 comprises calculating a given value for the property at one of the first and second primary nodes, the value being a function of the distance from the primary node to the secondary node.

In a first aspect of the invention, continuity is established between the first portion $D_1$ of the boundary D, which defines the discontinuity in the surface S, and the second portion $D_2$ of the boundary. More specifically, the continuity is established between secondary nodes on the first and second boundaries. Secondary nodes are preferably defined by identifying a portion of the boundary between common endpoint primary nodes and then segmenting the portion into an equal number of parts. As shown in FIG. 3, the first portion $D_1$ of the boundary D lies between nodes P(0) and P(1) on the upper surface S1. Common endpoint nodes P'(0) and P'(1) on the lower surface S2 define the second portion of the boundary $D_2$. The portions $D_1$ and $D_2$ can then be segmented into parcels $\delta$ to produce secondary nodes $\alpha$ and $\alpha'$ on the respective first and second portions of the boundary.

An interpolation criteria is then established for corresponding secondary nodes, for example $\alpha 0$ and $\alpha'$, to have essentially equal values. For example, knowing the distance of a first primary node $N_1$ from a second primary node on the same portion of the boundary (e.g., N3), and, knowing a distance from a secondary node α and the first and second primary nodes, one can calculate the value of the property at node α1 by interpolation or extrapolation.

Figure 5:
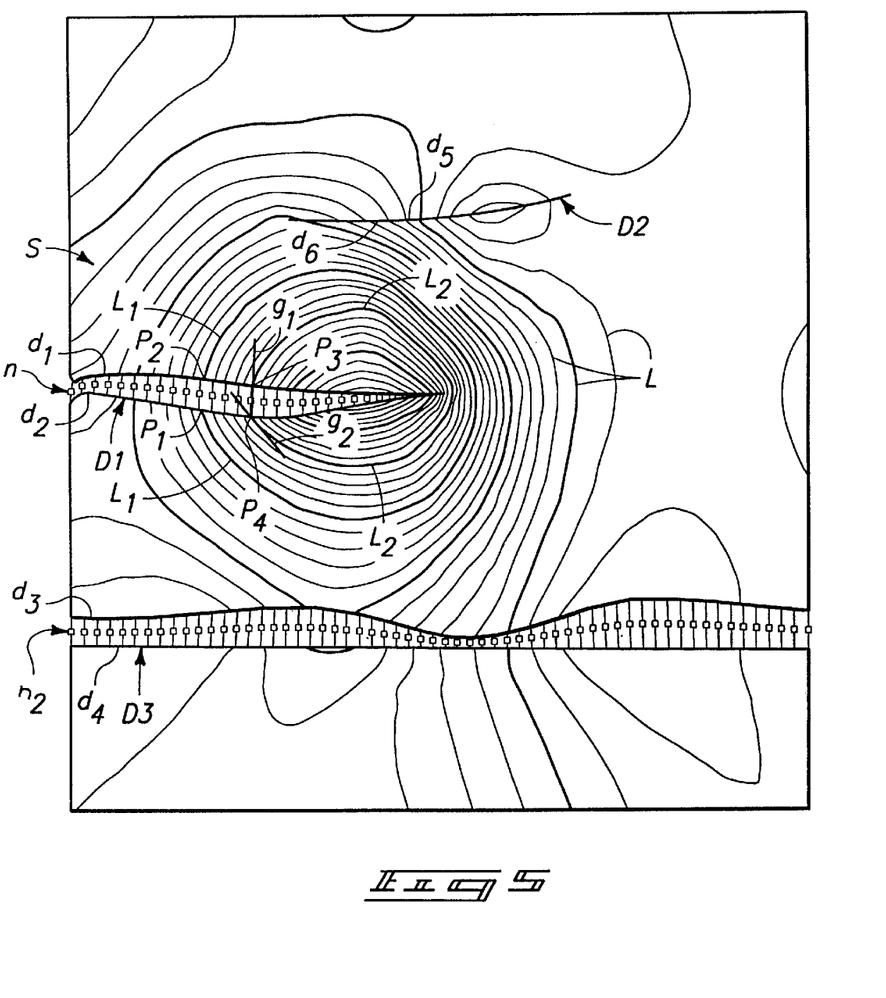
FIG. 5 depicts a surface having a property interpolated over discontinuities in the surface using a method of the present invention.

During the interpolation process, the values of primary nodes not on the boundary D are preferably calculated using a known interpolation method. Such known interpolation methods can be constrained in a number of known methods. However, in the present invention, when a primary node lies on the boundary D of the discontinuity, a secondary constraint is preferably added to provide a continuity to the property over the surface discontinuity. In one embodiment of the present invention, this constraint is the requirement that corresponding secondary nodes, which define the segments that the boundary is divided into, have equal values on both sides of the discontinuity. The result of this constraint is seen in FIG. 5. By comparison with the prior art depicted in FIG. 1, it is seen that points P1 and P2 of Line L1 do not match up across the discontinuity D1 in FIG. 1. However, in FIG. 5, it is seen that points P1 and P2 now have the same value, essentially joining line L1 in a continuous manner across the discontinuity D1. This method of the invention of correcting the mapping of the function φ onto the surface S will be termed a $C^0$ continuity.

When the interpolation is performed for primary points on the boundary of the discontinuity, it is performed in such a manner that the values at corresponding secondary nodes defined by the segments δ, as shown in FIG. 3, substantially converge to essentially the same value. Alternately, the interpolation method can be described as constraining the difference in the values between the corresponding secondary nodes to converge essentially to zero.

Figure 2A:
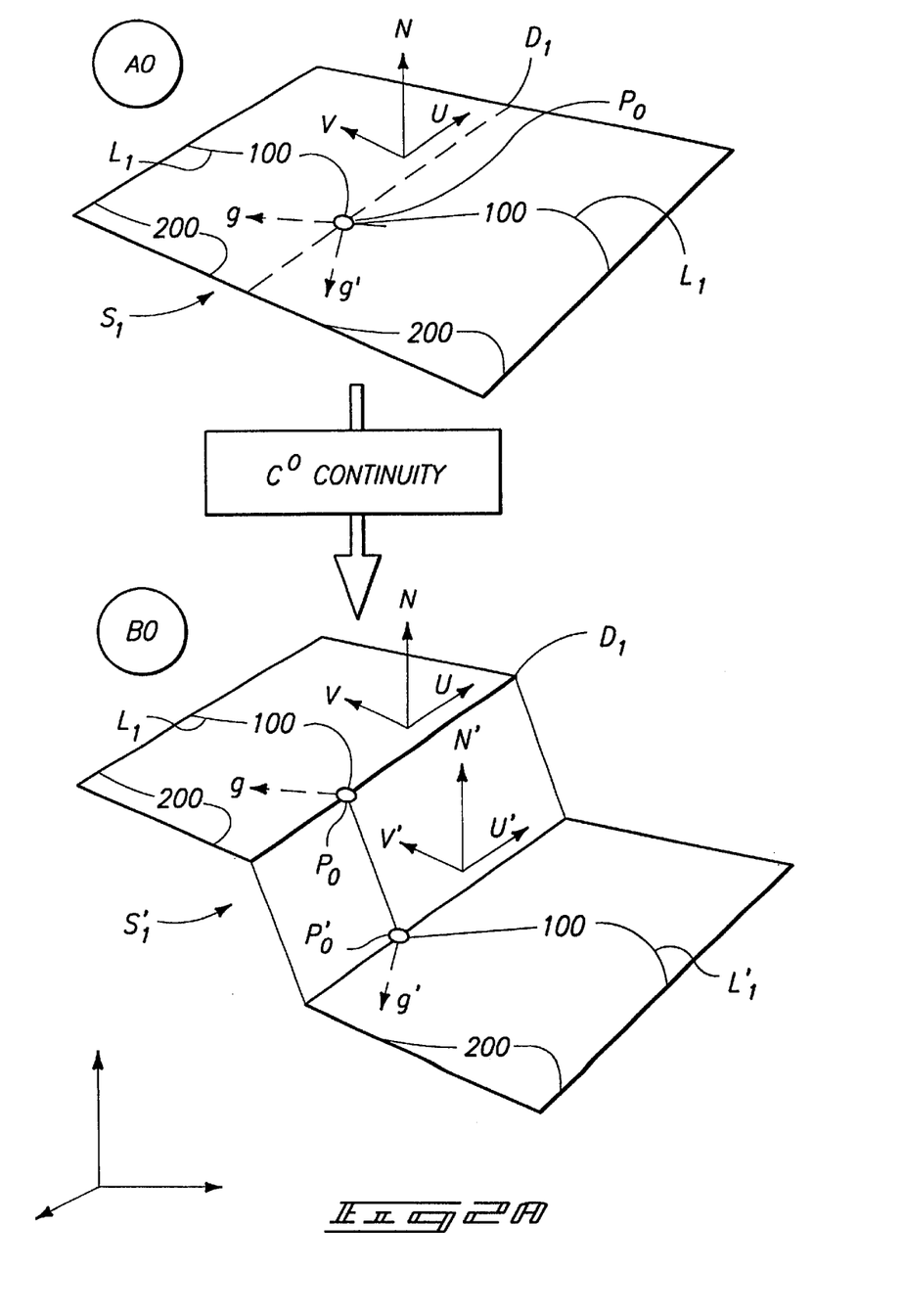
FIG. 2A depicts the concept of a $C^0$ type pseudo-continuity.
Figure 2B:
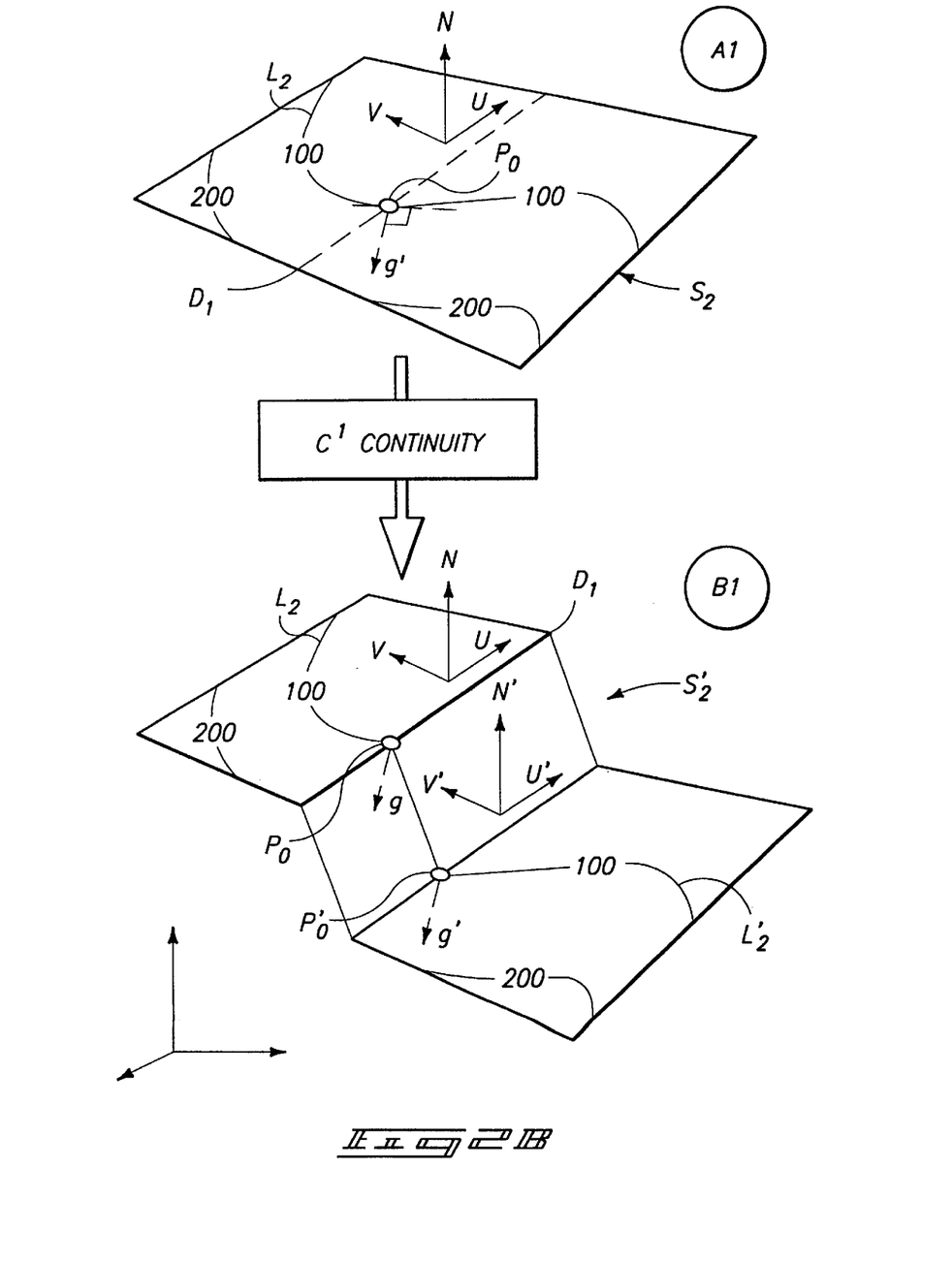
FIG. 2B depicts the concept of a $C^1$ type pseudo-continuity.

The result of applying a $C^0$ continuity is shown in FIG. 2A. By establishing the value of P0 and P'(0) as being equal, the end points of line L1 terminate at substantially the same point. However, as shown in the restored surface $S_1$, a $C^0$ continuity does not necessarily guarantee smoothness of the function defining L1 across the discontinuity D1. Therefore, it is desirable to provide additional steps for producing a smoothness to the property of the function across the continuity. Turning now to FIG. 2B, this desired smoothness is represented on surface $S_2$ wherein line L2 makes a smooth transition across the discontinuity D1, which is shown in a restored manner for plane $S_2$ and in an unrestored manner in plane $S'_2$. For example, comparing the line L1 on plane $S_1$ in FIG. 2A with line L2 on plane $S_2$ in FIG. 2B, and further providing the additional constraint that there be continuity not only of the value of the property at point $p_0$, but also of the slope or gradient of the property, provides for a more likely and desirable image.

Returning now to FIG. 3, the node spacing for the global topological surface S is selected such that a plurality of primary nodes N define the boundaries D1 and D2 of the discontinuity D. The number of segments δ which are defined to result in secondary nodes n1, n2, etc., and n'$_1$, n'$_2$, etc., are selected such that there are at least as many secondary nodes as primary nodes defining boundary D. More preferably, the number of secondary nodes is greater than the number of primary nodes on either portion D1 or D2 of the boundary.

In configuring the original topological model of a surface, it can occur that the number of primary nodes on the first portion D1 of the boundary and the number of primary nodes on the second portion D2 of the boundary are not the same. Thus, it is not always possible to link the two portions of the boundary using the primary nodes. However, using an equal number of secondary nodes does permit such linking. In this regard, by knowing the distance from the secondary nodes to the primary nodes and using linear interpolation, one can calculate values for all of the secondary nodes on the boundary of the discontinuity as well as the primary nodes on the boundary of the discontinuity. Thus, the method produces increasingly accurate results for the values of the property at the primary node. This is noteworthy because the values at the primary nodes are typically the only values stored and used to generate images of the property as applied to the surface.

Referring again to FIG. 1 and FIG. 5, secondary nodes are represented by lines n. While values are typically only saved for specific points such as P1 and P2, the effect of using the secondary nodes n to provide a continuity for the function of the property as it is interpolated along line L1 is clearly seen in the improved imaging of line L1 as depicted in FIG. 5 and as compared to the imaging of line L1 in FIG. 1.

As seen in FIG. 5, nodes n spatially link the first portion $d_1$ with the second portion $d_2$ of discontinuity $D_1$. In like manner, nodes n2 link first portion $d_3$ with second portion $d_4$ of discontinuity D3. At discontinuity D2, the first portion $d_5$ and the second portion $d_6$ are similarly linked, although the nodes lie along the common line D2 of the discontinuity. However, discontinuity D2 can have a differential number of primary nodes on each side of the discontinuity. This spatial linking of the two sides of a discontinuity with secondary nodes provides a pseudo-continuity across the surface discontinuity, which is then used to constrain the property, thereby producing an improved image.

Returning to FIG. 3, the discontinuity D is preferably identified by endpoints P(0) and P(1) on the first portion D1, and P'(0) and P'(1) on the second portion D2. This allows a local coordinate system to be put in place, the local coordinates spanning between 0 and 1. The portion of the boundary D is then segmented into m segments. By knowing the distance between the endpoints, which is set by the defined topology of the surface, and knowing the number m, one can readily determine the position of any secondary node n defined by a segment m with respect to any primary node N which lies along the respective portion of the boundary which defines discontinuity. In establishing the continuity criteria for interpolation of the primary nodes on the boundary, corresponding secondary nodes are constrained to converge to the same value of the property. Once substantial convergence has been reached, the primary nodes, which are interpolated essentially simultaneously, will substantially converge on a given value to provide continuity across the surface discontinuity.

Preferably, in the interpolation process, the values for primary nodes on the discontinuity are first calculated. Thereafter, values at secondary nodes are calculated based on the value at the primary nodes, and the distance of the secondary node from the nearest primary node, by using a linear interpolation method. The resulting value of the corresponding secondary nodes is then compared. If one secondary node has a different value than its corresponding secondary node on the other portion of the discontinuity, the value at the local primary nodes is again recalculated. Further, the values at the secondary nodes are again recalculated in the manner just described. This iterative process continues until values for the primary nodes are selected to essentially achieve equality between corresponding secondary nodes.

Thus, in one form of the invention, the method of establishing a continuity of a property which is to be interpolated over a surface includes the step of accessing a surface data set which is representative of a surface S over which a property is to be modeled, and a function ϕ describing the property as a function of a location on the surface. The surface data set comprises a numerical values defining spatial coordinates for a plurality of spaced-apart nodes which collectively define at least a part of the overall surface. The method then includes identifying the first and second portions (D1 and D2 of FIG. 3) of a boundary which defines a discontinuity D in the surface S, the surface defined by at least two primary points or nodes N and N1. Following identifying the first and second portions of the boundary, the portions are defined by defining at least one secondary node on each portion, and preferably by a plurality of secondary nodes on each portion. Such secondary nodes can be defined by segmenting the boundary into an equal number of segments along the discontinuity. After defining the first and second portions of the boundary by secondary nodes, the method further comprises substantially simultaneously interpolating the property from one of the first primary nodes to a second primary node by utilizing the value of the property at the secondary nodes. Thereafter, the data set can be identified as a modified data set, and the data set can either be stored or displayed.

These steps can all be performed in a manner similar to that described about with respect to the first disclosed embodiment of the invention. That is, the steps can be performed using a computer, and the data set (both the original data set and the modified data set) stored on a computer-readable memory. Further, the steps of defining portions of the boundary can comprise identifying data values representative of nodes on the boundary portions. Finally, the step of defining the secondary nodes can be accomplished by generating data values which have spatial coordinates to locate the secondary nodes as described.

The method also comprises a step of interpolating the property to the second primary nodes while interpolating the property from the first primary node to the second primary node. More preferably, the number of secondary nodes selected to define the first and second portions of the boundary are greater than the number of primary nodes which are found on either portion of the boundary.

The secondary nodes are preferably spatially linked to one another by virtue of the segmentation of the boundary, and are spatially linked to the primary nodes by the relative locations of the secondary nodes and the primary nodes on each of the first and second portions of the boundary.

In one embodiment, the surface onto which the property is to be mapped is topologically defined by a plurality of primary nodes, as described above. The primary nodes are mathematically associated with one another to provide a plurality of triangles having apices at the primary nodes and triangle edges connecting the primary nodes. First and second boundaries which define the discontinuity in the surface are identified. Since the surface is defined topologically, any boundaries, including the boundaries of the discontinuity, will comprise triangle edges. Those triangle edges which lie along the boundary of the discontinuity will be identified as boundary triangle edges. The primary nodes which define the boundary triangle edges are identified so that the continuity constraint can be preferably applied to only those primary nodes. Performing the method in the fashion described will reduce the number of calculations which must be performed to interpolate the values of the property to an acceptable solution. The boundaries of the discontinuity are then segmented into an equal number of segments. The junction of segments can be defined as secondary nodes. Ideally, the size and location of the segments are known such that the location of these "secondary nodes" is also known. In the present method, for each secondary node on a first portion of the boundary, there is preferably a corresponding secondary node on the second portion of the boundary.

The method of determining a property value for the primary nodes along the boundary of the discontinuity comprises calculating a first value of the property at a first primary node on the first boundary using the function ϕ, and calculating a second value of the property at a second primary node on the first boundary, also using the function ϕ. A third value of the property is then determined at the location of a secondary node (junction of two segments) or the location of a segment on the first boundary. The third value can be determined by linearly interpolating between the first and second values using the distance from the first primary node to the location of the second primary node in a scalar manner. A fourth value of the property is calculated at a third primary node which is located on the second discontinuity boundary. The fourth value of the property is calculated as a function of the distance of the third primary node from the location of the segment on the second boundary, and as a function of the third value of the property. All of these steps can be performed using a computer.

This establishes values of the property at three primary nodes and two secondary nodes. These values can then be recalculated by utilizing a global interpolation method which can have global interpolation constraints placed thereon. However, when the values of the property are recalculated for the primary nodes and the secondary nodes on the boundary, the additional constraint disclosed herein is further applied to provide a continuity of the function across the surface discontinuity.

In one embodiment of the invention, the above method is defined mathematically, and wherein the value of the property at the location "i" of a segment on the first boundary is given by $P(s_1)$; and wherein the value of the property at the corresponding location i' of a segment on the second boundary is given by $P'(s_1)$; and wherein:

$$\begin{cases} P(s_i) = u_i \cdot p(\alpha_1) + (1 - u_i) \cdot p(\alpha_0) \\ P'(s_i) = u'_i \cdot p(\alpha'_1) + (1 - u'_i) \cdot p(\alpha'_0) \end{cases} ;$$

and wherein $p(\alpha_i)$ is the value of the property at location i; and wherein $p(\alpha_i')$ is the value of the property at location i't; and wherein $P(s_0)$ and $P(s_1)$ define endpoints of the first boundary, and $P(s_i)$ defines intermediate points of the first boundary; and wherein $P(s'_0)$ and $P(s'_1)$ define endpoints of the second boundary, and $P(s'_i)$ defines intermediate points of the second boundary; and wherein $$\begin{cases} P(s_i) \epsilon (\alpha_0, \alpha_1) \\ P'(s_i) \epsilon (\alpha'_0, \alpha'_1) \end{cases} ; \text{ and wherein}$$

$$u \epsilon [0, 1] \text{ and } u' \epsilon [0, 1].$$

The formulas set forth above provide a useful coordinate system for interpolation of the values of the property at the secondary nodes. Further, these formulas can be reduced to a set of computer-executable instructions (i.e., a "program") and implemented by executing instructions using a processor in a computer. It is to be appreciated that other reference systems can be used and other base reference points selected to establish continuity of values at primary and secondary nodes across the surface discontinuity.

Still further in the method of providing a $C^0$ constraint to the interpolation of values of the property on the surface, the method comprises the interpolation of the third value of the property at the location of the segment on the first boundary of the discontinuity and which is constrained according to the formula $\Sigma\beta\epsilon\Omega A_c(\beta)\cdot\phi(\beta)-b_c=0$, and wherein: $\phi$ is a function which defines the property to be interpolated on the discrete set of nodes $\Omega$ of the surface; and wherein ($\phi=\{\phi(\alpha)/\forall\alpha\epsilon\Omega\}$); and wherein:

$$\begin{cases} A_c(\alpha_0) &= 1-u_i \\ A_c(\alpha_1) &= u_i \\ A_c(\alpha'_0) &= 1-u'_i \\ A_c(\alpha'_1) &= u'_i \\ A_c(\beta) &= 0 \quad \forall\,\beta\epsilon\Omega\backslash\{\alpha_0,\alpha_1,\alpha'_0,\alpha'_1\} \\ b_c &= 0 \end{cases}$$

and wherein $\Omega$ is the set of primary nodes comprising the surface; and wherein $\forall\beta\epsilon\Omega\backslash\{\alpha 0, \alpha 1, \alpha 0', \alpha 1'\}$ substantially includes all $\beta$ that are a member of the set $\Omega$, except for $\{\alpha 0, \alpha 1, \alpha 0', \alpha 1'\}$.

Figure 6:
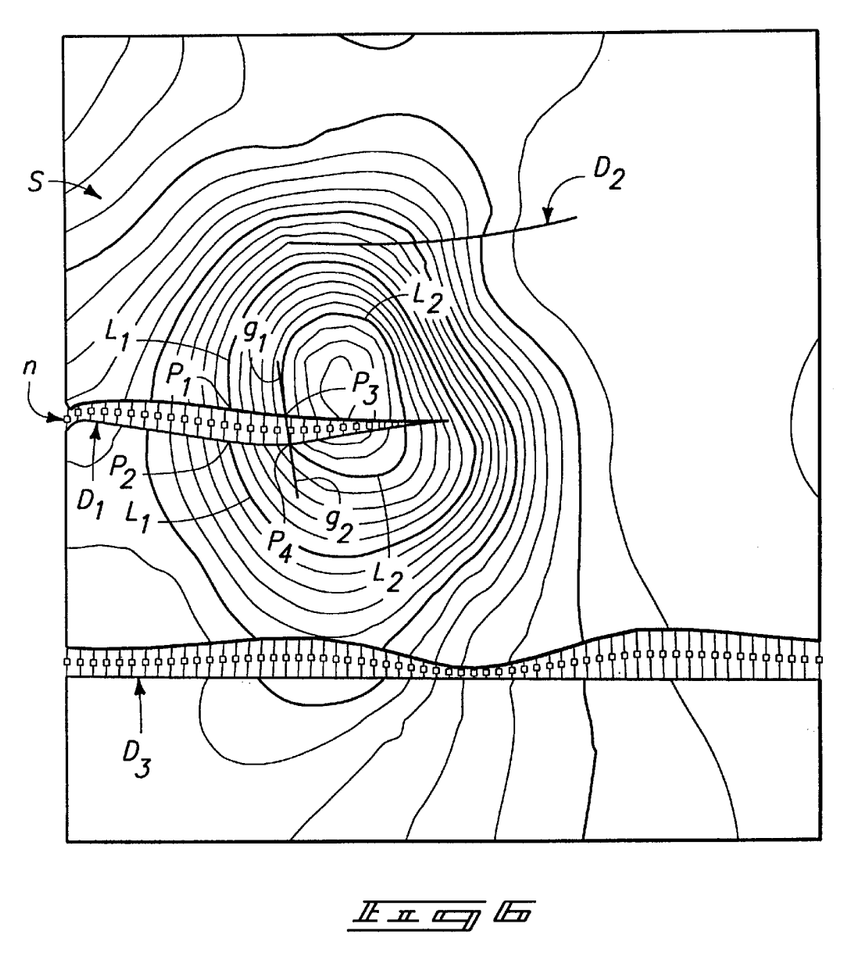
FIG. 6 depicts the surface of FIG. 5 but further including a step of the method of adding a pseudo-$C^1$ constraint.

As discussed above, it is preferable to provide an additional continuity constraint to improve the resulting image of the property when applied to the surface. Turning now to FIG. 5, it can be seen that, while line L2 has the same value at points P3 and P4, the gradients g1 and g2 of the points at the boundaries of the discontinuity D1 are substantially different. The gradients essentially define the slope or rate of change of the function at the point where the property is applied to the boundary of the discontinuity. Turning now to FIG. 6, it is seen that line L2 converges on discontinuity D1 such that points P3 and P4 intersect the continuity with the same gradient g1 and g2. A close comparison of FIGS. 5 and 6 shows that using the additional constraint of continuity of the gradient across the discontinuity in the surface provides a much improved image. Thus, another aspect of the present invention is using gradients of a property at secondary nodes as a constraint to provide continuity of the property across a surface discontinuity.

In one implementation of the method of using the gradient as a constraint for interpolating the property across a discontinuity, the gradient is first determined for primary nodes on the boundary portion of the discontinuity. Thereafter, gradients are determined for secondary nodes on the boundary of the discontinuity. The continuity constraint is established such that the gradients at corresponding secondary nodes are to be equal or, stated another way, the difference in gradients between corresponding secondary nodes should substantially approach zero as the gradients of the primary nodes are calculated by interpolation.

Figure 4:
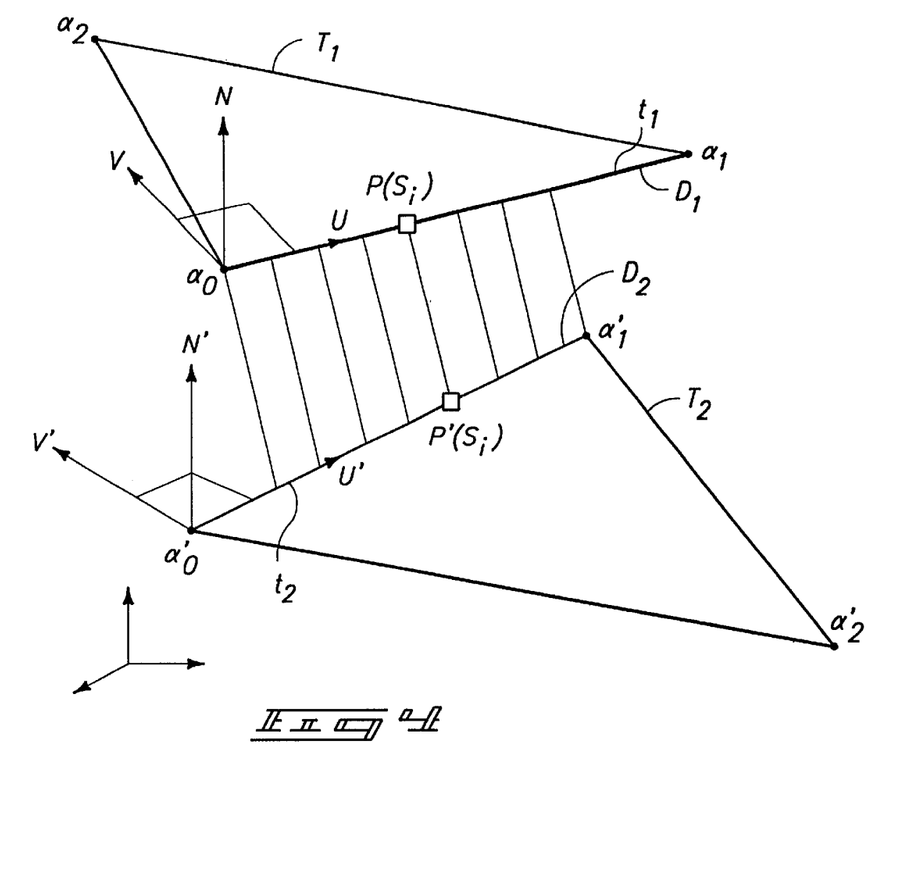
FIG. 4 depicts a step in the method of the present invention of linking two twin locations of associated triangles and the local coordinate systems on a triangulated surface.

Turning to now FIG. 4, in a preferred embodiment, a gradient at $\alpha_0$ and $\alpha_1$ is calculated. In this regard, knowing the spatial position of secondary node $P(S_i)$ with respect to primary nodes $\alpha 0$ and $\alpha 1$, and by linear interpolation, the value of the gradient at secondary node $P(S_i)$ can readily be calculated. In like manner, gradients on the second portion D2 of the boundary along the discontinuity D can be calculated, as well as the gradient of secondary node $P'(S_i)$, by the interpolation method described above for corresponding node $P(S_i)$. The values of the gradients at the corresponding secondary nodes are then compared and the gradients at the primary nodes $\alpha 0$, $\alpha 1$, $\alpha'$, and $\alpha'1$ are recalculated as part of an iterative interpolation process, and the value of the gradients at corresponding nodes $P(S_i)$ and $P'(S_i)$ are compared and checked for convergence. The manner of adjusting values of primary nodes and checking for convergence, and making adjustments to the values at the primary nodes in order to achieve convergence towards a criteria, are well known and will not be described otherwise herein. These steps can all be implemented by reducing them to a set of computer-executable instructions which can then be executed by a computer.

In the present method, triangles defined by primary nodes are defined at each of the first and second portions of the boundary. Turning now to FIG. 4, first, second, and third primary nodes $\alpha 0$, $\alpha 1$, and $\alpha 2$, respectively) are selected to define triangle $T_1$. Triangle $T_1$ has a triangle edge $t_1$ which lies along the first portion of the boundary D1. In like manner, primary nodes $\alpha'0$, $\alpha'1$, and $\alpha'2$ are selected to define triangle $T_2$ having boundary triangle edge $t_2$ lying on the second portion D2 of the boundary of the surface discontinuity. A first gradient property of the function is then calculated for triangle $T_1$, and a second gradient function is calculated for triangle $T_2$.

Using the first gradient function, a first gradient is calculated at a selected secondary node $P(S_i)$. Using the second gradient function, a second gradient of the property at the corresponding secondary node $P'(S_i)$ is calculated on the second portion D2 of the boundary of the surface discontinuity.

The gradient g at a point P(O) is shown in FIGS. 2A and 2B. In FIG. 2A, the result of mapping the property onto the surface $S'_1$ without maintaining continuity of the gradient is shown. The result wherein the continuity of the gradient is maintained is displayed in FIG. 2B. As discussed above, maintaining continuity of the gradient across the surface discontinuity provides a more realistic result, since properties are more frequently continuous than discontinuous.

Turning now to FIG. 3, it is seen that a first portion D1 and second portion D2 of the boundary of the discontinuity D can be represented by a plurality of boundary triangle edges. In the preferred embodiment, the gradient is calculated for each triangle having a triangle edge on the boundary of the discontinuity D. For example, for triangle T1 of FIG. 4, a gradient function is calculated for the triangle and the gradient of the property is calculated at secondary nodes n1 and n2.

In like manner, the gradient function is calculated for triangle T2 and the gradients calculated for the corresponding secondary nodes $n'_1$ and $n'_2$. The present method of calculating gradient functions and gradients is performed in each triangle between terminal endpoint P(0) and P(1) on the first portion D1 of the boundary, and for the corresponding endpoint nodes P'(0) and P'(1) on the second portion D2 of the boundary.

As with calculating the $C^0$ continuity, discussed above, calculating the $C^1$ continuity is preferably used with a larger number of secondary nodes on the boundary of the discontinuity than the largest number of primary nodes on either portion of the boundary.

Turning now to FIG. 4, a first triangle T1, and a second triangle T2, defined by respective first, second, and third primary nodes, are shown. Each triangle has its own local coordinate system U, V, and N assigned to the triangle, and an identical corresponding set of primary nodes $\alpha 0$ and $\alpha'0$. As seen in FIG. 4, initially the two sets of coordinate axes may not be in alignment, as particularly indicated by axes V and V'. Likewise, the coordinates at secondary nodes $P(S_i)$ and $P'(S_i)$ may initially be different.

Since a gradient can be defined by a three-point axis system, one method of defining the gradient for each of the triangles $T_1$ and $T_2$ is to assign a local coordinate system to each triangle. Since gradient continuity is preferably used in conjunction with property value continuity, by definition, points α0 and α'0 will be common following interpolation, and, therefore, there will be no variation in axis N. Thus, as an initial starting point, the variation in axes will be constrained to the U and V axes. If a local coordinate system is established having U and V coordinates of [0,0] at α0 and α', and the coordinate at α1 and α2 are defined as 1, then the coordinate of a secondary node P(S$_i$) will be somewhere between 0 and 1 in the local coordinate system. Corresponding secondary node P'(S$_i$) will likewise be definable by a similar local coordinate system, (v', u'). More particularly, the method of the invention comprises the steps of defining a local coordinate system for each of the selected triangles on the first boundary of the discontinuity as {α0, α1, α2}, etc.; defining a local coordinate system for each of the selected triangles on the second boundary of the discontinuity as {α0', α1', α2'}, etc.; defining the locations of the segments along the first boundary triangle edges by a segment coordinate system (u$_i$, v$_i$), where i ∈ {0, . . . , i, . . . 1}; and defining the locations of the segments along the second boundary triangle edges by a segment coordinate system (u$_i$', v$_i$'), where i∈{0, . . . , i, . . . 1}.

A first gradient function is calculated for the first triangle T1 using the local coordinate system, such that gradient g is a function of (u$_i$, v$_i$). Likewise, the local coordinate system for triangle T2 can be used to determine a second gradient function which is a function of (u'$_i$, v'$_i$). The first gradient function can then be used to calculate the gradient at any secondary point P(S$_i$) on the first portion D1 of the boundary. Likewise, the second gradient function can be used to calculate a second gradient of the property at a secondary point P'(S$_i$) on second portion D2 of the boundary. In the interpolation, first and second values of the property are first calculated for respective first and second primary nodes on the first boundary D1 of the discontinuity. A third value of the property at the location of a segment on the first boundary is linearly interpolated as a function of the distance of the segment from the first primary node, and as a function of the first and second values of the property at the respective first and second nodes. This third value of the property at the location of the segment on the first boundary is assigned to the corresponding location of the segment on the second boundary. A fourth value of the property is calculated at a third primary node on the second boundary. The fourth value of the property is calculated as a function of the distance of the third primary node from the location of the corresponding segment on the second boundary, and the third boundary of the property.

The step of interpolating comprises calculating the first and second gradient functions in the manner described above. The calculating of the four values of the property, and the first and second gradient functions, is performed in a manner to cause the first and second gradients to substantially converge towards one another. In this regard, the calculating of the first and second gradient functions is an interpolation substantially constrained by a formula which comprises calculating a first gradient function for a first triangle having a boundary triangle edge on the first boundary of the discontinuity; calculating a second gradient function for a second triangle having a boundary triangle edge on the second boundary of the discontinuity; calculating a first gradient at the location of the segment on the first boundary of the discontinuity using the first gradient function; and calculating a second gradient at the corresponding location of the segment on the second boundary of the discontinuity using the second gradient function.

In the present method, the values of the property to be mapped onto the surface are established at selected primary nodes on the surface by interpolation, and the interpolation is constrained by the interpolation criteria:

$$J^*(\varphi) = J(\varphi) + \sum_{c \in C} \overline{\omega}_c \cdot \left| \sum_{\alpha \in \Omega} A_c(\alpha) \cdot \varphi(\alpha) - b_c \right|^n ; \text{ and wherein}$$

J(ϕ) is a predetermined interpolation criteria for primary nodes other than primary nodes on the boundaries of the discontinuity;

n is selected according to J(ϕ); and $\overline{\omega}_c$ is a given, positive weighting factor.

A common, predetermined interpolation criteria utilized in the present invention is a quadratic interpolation criteria. When a quadratic interpolation criteria is used, n in the above equation is preferably equal to 2.

In one embodiment of the present method, the interpolation of the values of the property over the surface is performed using the discrete smooth interpolation method. All of these interpolation processes can be implemented using a computer which runs a program which comprises a set of computer-executable steps which, when executed by the computer, replicate or approximate the interpolation processes.

Whereas the $C^0$ continuity establishes as a criteria establishing equal values for the property at corresponding secondary nodes on the two portions of the boundary, the $C^1$ continuity is based on the gradient of the values of the property at these locations. Since the gradient of a property is the derivative of the value, it can be seen that the $C^1$ continuity constitutes a first order derivation of the $C^0$ continuity. In like manner, a $C^2$ continuity can also be established which would consider not just the gradient of the secondary nodes at the boundaries of the discontinuity, but the rate at which the gradients are changing as they approach the boundary of the discontinuity. Depending on the property being mapped onto the surface, it is possible to conceive of $C^3$ and subsequent continuities being further derivatives of the function which describes the property being mapped onto the surface.

EXAMPLE

As a further example of the invention, assume ϕ defines a function of a property discretized over a set of nodes Ω corresponding to the vertices of a triangulated surface and known at some locations and unknown at other locations. From a mathematical point of view, this is an interpolation problem, having known possible solutions. Some prior art interpolation methods are based on a given criterion J(ϕ), and the interpolation solution is chosen such that the value of this criterion is minimized. The present invention relates to a modified interpolation criterion J*(ϕ) of the following form, where n≧1 is given, and $\overline{\omega}_c$ is given a positive weighting factor:

$$J^*(\varphi) = J(\varphi) + \sum_{c \in C} \overline{\omega}_c \cdot \left| \sum_{\alpha \in \Omega} A_c(\alpha) \cdot \varphi(\alpha) - b_c \right|^n$$

That is, J*(ϕ) is an objective function that can be modified by a linear combination of the values of ϕ. The value of n is chosen in order to respect the formulation of J(ϕ). For example, if J(ϕ) is a quadratic criterion, it is preferable to choose n=2. The following examples demonstrate that both the $C^0$ and $C^1$ continuities of ϕ across internal borders of the triangulated surface can be restored using this equation, which embodies the method of the present invention. As a further example, these equations have been incorporated into the Discrete Smooth Interpolation (D.S.I.) method, described in U.S. Pat. No. 5,465,323 which is hereby incorporated by reference in its entirety. The interpolation results presented as illustrations herein all use the D.S.I. method, although the constraint method disclosed herein can be used with other interpolation methods and criteria.

In the present example, initially the surface S holding the property $\phi$ was assumed to be in one piece but, for various reasons, this surface has been cut and deformed and now presents discontinuities. The problem is to modify the existing interpolation methods in order to re-establish the continuity of $\phi$ as it was prior to the cut of S by some discontinuities. FIG. 1 illustrates an instance where the present invention can be used. FIG. 1 shows a property interpolated over a discontinous surface using prior art methods. The property, displayed here as contour lines, is also discontinous. The lines inside the discontinuities represents the directions along which one can reconcile the two sides of the discontinuity will be reconciled when interpolating this property.

With respect to $C^0$ versus $C^1$ continuity consider a point $p_0$ located on a continuous surface S as shown in FIGS. $2A_{A0}$ and $2B_{A1}$. In the vicinity of $p_0$, it is possible to approximate locally the surface S by its tangent plane at $p_0$. In the vicinity of $p_0$, if one draws the contour lines of a property defind by a function $\phi$ on the tangent plane to S, then one will find:

In FIG. $2A_{B0}$ an example of function $\phi$ which is $C^0$-continuous at $p_0$ (white circle) but which is $C^1$-discontinuous at that point (See FIG. $2A_{A0}$); and In FIG. $2B_{B0}$ an example of function $\phi$ which is $C^1$-continuous at $p_0$ (See FIG. $2B_{A1}$).

After introducing a geometrical discontinuity, $p_0$ is split into two distinct locations $p_0$ and $p'_0$. Introducing a pseudo-$C^0$ continuity basically means the value of $\phi$ will be substantially identical in $p_0$ and $p'_0$, while introducing a pseudo-$C^1$ continuity means both the value of the function $\phi$ and its gradient will be substantially identical (FIGS. $2A_{B0}$ and $2B_{B1}$).

In addition to the foregoing, consider a discontinous triangulated surface S and a function $\phi$ to be interpolated on the discrete set of nodes $\Omega$ of S ($\phi=\{\phi(\alpha)/\forall\alpha\in\Omega\}$) corresponding to a physical property attached to the surface. The surface S is assumed to be affected by (at least) one surface discontinuity. It is desirable to restore the continuity of the property over this geoetrical discontinuity.

A first step in one embodiment of the present invention is to mathematically link the two sides of the discontinuity. This first step will now be described in detail.

From the surface point of view, a discontinuity can be seen as an "internal" border. Such an internal border is divided in two twin parts (one on each side of the discontinuity) corresponding to two twin curves {P(s):s$\in$[0, 1]} and {P'(s):s$\in$[0,1]} (see FIG. 3) such that P(s) and P'(s) are assumed to be coincident prior to the cutting of the surface by the discontinuity for any s$\in$[0,1]

Each of these two twin curves can be digitized into m+1 equally spaced points {$P(s_i)$:i=0 ... m} and {$P'(s_i)$:i=0 ... m} in such away that $s_i$=i/m. As shown in FIG. 3, it is then possible to create a polygonal line D($\Delta$) corresponding to a set $\Delta$ of (m+1) nodes: $\delta_i$:$\Delta$={$\delta_0$, ..., $\delta_i$, ..., $\delta_m$}

This definition establishes a link between the nodes of triangulated surface located on both sides of a discontinuity. Such a link can be expressed as a linear combination of values at nodes of the surface which is expressed in FIG. 4 as:

$$\begin{cases} P(s_i)\in(\alpha_0, \alpha_1) \\ P'(s_i)\in(\alpha'_0, \alpha'_1) \end{cases}$$

If we note p($\alpha$) the 3D point corresponding to the location of a node $\alpha\in\Omega$, then the relative locations of $P(s_i)$ and $P'(s_i)$ on the two edges ($\alpha_0,\alpha_1$) and ($\alpha'_0,\alpha'$can be defined by the parameters u$\in$[0,1] and u'$\in$[0,1] such that:

$$\begin{cases} u_i = \dfrac{\|p(\alpha_0) - P(s_i)\|}{\|p(\alpha_0) - p(\alpha_1)\|} \\ u'_i = \dfrac{\|p(\alpha'_0) - P'(s_i)\|}{\|p(\alpha'_0) - p(\alpha'_1)\|} \end{cases}$$

Using parametric linear interpolations on edges ($\alpha_0,\alpha_1$) and ($\alpha'_0,\alpha'_1$), one can then write:

$$\begin{cases} P(s_i) = u_i \cdot p(\alpha_1) + (1 - u_i) \cdot p(\alpha_0) \\ P'(s_i) = u'_i \cdot p(\alpha'_1) + (1 - u'_i) \cdot p(\alpha'_0) \end{cases}$$

In the next step of one embodiment of the present invention, corresponding secondary nodes ($\alpha_0,\alpha_1$) and ($\alpha'_0, \alpha'_1$) are defined to have the same final value following interpolation. This step can be described as introducing a $C^0$ pseudo-continuity, and constitutes constraining the continuity of the values from one edge of the discontinuity to the other. This can also be described as an interpolation criteria $J^*(\phi)$. To introduce a so-called pseudo-$C^0$ continuity into the interpolation process for a given property a given pair ($P(s_i)$,$P'(s_i)$) (see FIG. 4), the continuity constraint can be written as:

$$\hat{\varphi}(P(s_i)) - \hat{\varphi}(P'(s_i)) =$$
$$0 \Leftrightarrow u_i \cdot \varphi(\alpha_1) + (1 - u_i) \cdot \varphi(\alpha_0) - u'_i \cdot \varphi(\alpha'_1) - (1 - u'_i) \cdot \varphi(\alpha'_0) = 0$$

where $\phi(P)$ represents the linear interpolation of $\phi$ at location P. It should be noted that this constraint is a linear equation. If we define $A_c(\alpha)$ and $b_c$ in the following form:

$$\begin{cases} A_c(\alpha_0) &= 1 - u_i \\ A_c(\alpha_1) &= u_i \\ A_c(\alpha'_0) &= 1 - u'_i \\ A_c(\alpha'_1) &= u'_i \\ A_c(\beta) &= 0 \quad \forall \beta\in\Omega\backslash\{\alpha_0, \alpha_1, \alpha'_0, \alpha'_1\} \\ b_c &= 0 \end{cases}$$

then the $C^0$ continuity equation can be written in the form $\Sigma\beta\in\Omega A_c(\beta)\cdot\phi(\beta)-b_c=0$. Such a constraint can be taken into account by a number of interpolation methods, such as the D.S.I. method described above. The result of introducing this constraint is shown in FIG. 5.

In a further step of one embodiment of the present invention, corresponding secondary nodes (u, v) and ($u_1$, $v_1$) are defined to have the same final gradient of the function of the property $\phi$ following global interpolation. This step can be described as introducing a $C^1$ pseudo-continuity, and constitutes constraining the gradient of the function $\phi$ from one edge of the discontinuity to the other. This can also be described as an interpolation criteria $J^*(\phi)$. Preferably, $C^0$ and $C^1$ continuity constraints are used at the same time. One example of introducing a pseudo-$C^0$ continuity will now be described.

A gradient can be expressed as a linear combination of the values at the two corresponding triangles of the surface on each side of the discontinuity. Hence, the continuity of the gradient through a discontinuity fault can also be expressed as a linear equation and can be taken into account into the interpolation process.

Consider a given link between 2 corresponding triangles T (corresponding to $T_1$) and T' (corresponding to $T_2$) of a surface. FIG. 4 shows the linking of two twin locations $\{P(s_i), P'(s_i)\}$, associated triangles $T_1$ and $T_2$, and local coordinate systems (u, v) and $(u_1, v_1)$. In the method, two twin orthonormal coordinate systems (U,V,N) and (U',V',N'), are defined such that U and U' corresponds to the border segments respectively of the two triangles, and N and N' to their respective normals.

For purposes of this method, one should assume that originally, these coordinate systems were identical, i.e. that (U, V, N) were identical to (U', V', N') as in FIG. $2B_{A1}$. Thus, it is assumed in this method that having the gradient of the interpolated property be continuous between both sides is substantially equivalent to having the local coordinates of the gradient in (U, V, N) equal to their counterparts in (U', V', N'). Also, one considers a linear interpolation $\phi_T$ and $\phi_T'$ of a property on a triangle, then it follows that:

$$\frac{\partial \varphi_T}{\partial n} = \frac{\partial \varphi_{T'}}{\partial n'} = 0$$

so only the partial derivatives on the U (respectively U') and V (respectively V') directions will be considered.

Thus, the linear interpolation function of a property $\phi$ on the triangle T in the (U, V, N) coordinate system is defined as:

$$\phi_T(u, v) = [1 \ u \ v] \cdot [\alpha_0 \ \alpha_1 \ \alpha_2]^t$$

where $\{\alpha_0, \alpha_1, \alpha_2\}$ are such that:

$$\underbrace{\begin{bmatrix} 1 & u_0 & v_0 \\ 1 & u_1 & v_1 \\ 1 & u_2 & v_2 \end{bmatrix}}_{M'} \cdot \begin{bmatrix} a_0 \\ a_1 \\ a_2 \end{bmatrix} = \begin{bmatrix} \varphi(\alpha_0) \\ \varphi(\alpha_1) \\ \varphi(\alpha_2) \end{bmatrix}$$

and where $(u_i, v_i)$ are the coordinates of $\alpha_i$ in the (U,V,N) basis. By construction, $u_0 = v_0 = v_1 = 0$. $M_T$ will have an inverse $M_T^{-1}$. At this point, one can compute the partial derivatives of the function $\phi_T$ on T to be the following:

$$\begin{bmatrix} \frac{\partial \varphi_T}{\partial u} \\ \frac{\partial \varphi_T}{\partial v} \end{bmatrix} = \begin{bmatrix} 0 & 1 & 0 \\ 0 & 0 & 1 \end{bmatrix} \cdot M_T^{-1} \cdot \begin{bmatrix} \varphi(\alpha_0) \\ \varphi(\alpha_1) \\ \varphi(\alpha_2) \end{bmatrix}$$

and where the gradient vector is deduced as a linear combination of the $\phi(\alpha_i)$ values. A similar expression is derived for the gradient vector on the corresponding T' triangle by introducing a similar matrix $M_{T'}$, and therefore the $C^1$ continuity equation is expressed as:

$$\begin{bmatrix} 0 & 1 & 0 \\ 0 & 0 & 1 \end{bmatrix} \cdot M_T^{-1} \cdot \begin{bmatrix} \varphi(\alpha_0) \\ \varphi(\alpha_1) \\ \varphi(\alpha_2) \end{bmatrix} = \begin{bmatrix} 0 & 1 & 0 \\ 0 & 0 & 1 \end{bmatrix} \cdot M_{T'}^{-1} \cdot \begin{bmatrix} \varphi(\alpha'_0) \\ \varphi(\alpha'_1) \\ \varphi(\alpha'_2) \end{bmatrix}$$

Given the definition of $M_T$ and $M_{T'}$, one can verify that:

$$\begin{cases} \begin{bmatrix} 0 & 1 & 0 \\ 0 & 0 & 1 \end{bmatrix} \cdot M_T^{-1} = \frac{1}{u_1 v_2} \cdot \begin{bmatrix} -v_2 & v_2 & 0 \\ u_2 - u_1 & -u_2 & u_1 \end{bmatrix} \\ \begin{bmatrix} 0 & 1 & 0 \\ 0 & 0 & 1 \end{bmatrix} \cdot M_{T'}^{-1} = \frac{1}{u'_1 v'_2} \cdot \begin{bmatrix} -v'_2 & v'_2 & 0 \\ u'_2 - u'_1 & -u'_2 & u'_1 \end{bmatrix} \end{cases}$$

This expression leads to two linear combinations of the six values $\{\phi(\alpha_0), \phi(\alpha_1), \phi(\alpha_2), \phi(\alpha'_0), \phi(\alpha'_1), \phi(\alpha'_2)\}$, and to the two linear equations:

$$\begin{cases} \frac{v_2}{u_1 v_2} \cdot (\varphi(\alpha_1) - \varphi(\alpha_0)) - \frac{v'_2}{u'_1 v'_2} \cdot (\varphi(\alpha'_1) - \varphi(\alpha'_0)) = 0 \\ \frac{1}{u_1 v_2} \cdot ((u_2 - u_1) \cdot \varphi(\alpha_0) - u_2 \cdot \varphi(\alpha_1) + u_1 \cdot \varphi(\alpha_2)) - \\ \frac{1}{u'_1 v'_2} \cdot ((u'_2 - u'_1) \cdot \varphi(\alpha'_0) - u'_2 \cdot \varphi(\alpha'_1) + u'_1 \cdot \varphi(\alpha'_2)) = 0 \end{cases}$$

If $A_c^u(\alpha)$, $A_c^v(\alpha)$, $b_c^u$ and $b_c^v$ is defined in the following form:

$$\begin{cases} A_c^u(\alpha_0) = -\frac{v_2}{u_1 v_2} \\ A_c^u(\alpha_1) = \frac{v_2}{u_1 v_2} \\ A_c^u(\alpha'_0) = -\frac{v'_2}{u'_1 v'_2} \\ A_c^u(\alpha'_1) = \frac{v'_2}{u'_1 v'_2} \\ A_c^u(\beta) = 0 \qquad \forall \beta \in \Omega \setminus \{\alpha_0, \alpha_1, \alpha'_0, \alpha'_1\} \\ b_c^u = 0 \end{cases}$$

$$\begin{cases} A_c^v(\alpha_0) = \frac{u_2 - u_1}{u_1 v_2} \\ A_c^v(\alpha_1) = \frac{-u_2}{u_1 v_2} \\ A_c^v(\alpha_2) = \frac{u_1}{u_1 v_2} \\ A_c^v(\alpha'_0) = \frac{u'_2 - u'_1}{u'_1 v'_2} \\ A_c^v(\alpha'_1) = \frac{-u'_2}{u'_1 v'_2} \\ A_c^v(\alpha'_2) = \frac{u'_1}{u'_1 v'_2} \\ A_c^v(\beta) = 0 \qquad \forall \beta \in \Omega \setminus \{\alpha_0, \alpha_1, \alpha_2, \alpha'_0, \alpha'_1, \alpha'_2\} \\ b_c^v = 0 \end{cases}$$

then these equation can be written in the forms $\Sigma \beta \epsilon \Omega A_c^u(\beta) \cdot \phi(\beta) - b_c^u = 0$ and $\Sigma \beta \epsilon \Omega A_c^v(\beta) \cdot \phi(\beta) - b_c^v = 0$. These equations can be used again with an interpolation method capable of handling linear equations, such as the D.S.I. method.

FIG. 6 shows the results of the introduction of such a constraint. The resulting image gives a much better picture of the property than with only pseudo-$C^0$ continuity, as seen by comparing FIG. 6 with FIG. 5, which shows only a $C^0$ continuity.

As can be seen from the above, both the $C^0$ and $C^1$ continuity equations of a property can be written as simple, linear equations. Such equations can easily be used to modify existing interpolation methods based on an objective function and therefore used as constraints for the interpolation. Applications of these constraints have been shown in the field of geological modeling, for example to interpolate seismic reflectivities, porosities, etc. However, the application framework for these constraints is much broader, as described earlier.

Implementation

The present invention can be implemented using a computer which has a processor configured to execute a series of computer executable steps. The computer further comprises a computer readable memory device (the "program memory") which stores a series of computer readable, computer executable steps (i.e., a "computer program", or simply, a "program") which are to be executed by the processor. The program includes instructions for the processor to implement the steps of the methods described above. The program memory can be a read-only memory device, such as an optical disk, or it can be a read-write memory device, such as a disk drive or a magnetic tape or a semiconductor chip. The computer also includes a computer readable memory device (the "data memory") for storing data. The data memory can be the same as, or different than, the program memory when the program memory device is a read-write memory device. The data memory is used to store intermediate values calculated by the processor as instructed by the program. The computer is configured to access a source data storage device which can be used to hold the data set which is representative of the surface on which a property is to be applied. The source data storage device can be the same memory device as the data memory, or it can be different. For example, the source data storage device can be configured to read data from a magnetic tape or a magnetic disk, an optical disk (such as a CD or a DVD), or from a remote location via a communications network.

Accordingly, the present invention also provides for a computer-readable storage medium for use by a processor configured to execute computer executable instructions to improve continuity of a property which is interpolated over a surface, the surface being represented by a surface data set which is contained on a computer readable memory device and accessible by the processor. The data set defines the surface by a set of spatially separated points in space ("primary nodes"), with certain points being associated with neighboring points to thereby generate a finite element array representative of the surface. The property can be any physical property which can be ascribed to a surface, and typically which varies over the surface. By way of example only, the property can be pressure, light reflectivity, temperature, saturation, porosity, permeability, conductance, magnetic field intensity, density, and so on. The surface data set can also include a mathematical formula or formulas which describing the property.

In one embodiment the computer-readable storage medium holds computer executable instructions to perform the following steps:

1) Retrieve the surface data set from the computer readable memory device.
2) Identify data points (primary nodes) in the data set which define first and second portions of a boundary which defines a discontinuity in the surface.
3) Generate at least one secondary node on each of the first and second portions of the boundary to thereby further define the boundary.
4) Interpolate the property from a first primary node on the first portion of the boundary to a second primary node on the second portion of the boundary by utilizing the secondary nodes. And;
5) Store the data set which comprises the interpolated secondary nodes.

As an alternate step to storing the data set, the program can include the step of displaying the data set which comprises the interpolated secondary nodes.

In a first variation on the set of computer executable steps just described, the third step can be replaced with the following step:

3') Interpolate the property from a first primary node on the first portion of the boundary to a second primary node on the second portion of the boundary by utilizing the secondary nodes while maintaining a predetermined continuity between the corresponding secondary nodes.

Examples of a continuity which can be maintained is described above, and can include the value of the property at the secondary nodes, and the rate of change of the property at the secondary nodes.

In a second variation on the set of computer executable steps just described, the third step can be replaced with the following step:

3") Substantially simultaneously interpolate the property from a first primary node on the first portion of the boundary to a second primary node on the second portion of the boundary by utilizing the secondary nodes.

In a third variation on the set of computer executable steps just described, the surface data set can be configured such it topologically defines the surface by a plurality of primary nodes (numerical values) which are mathematically associated with one another to provide representations of a plurality of triangles having apexes at the primary nodes and triangle edges connecting the primary nodes. The set of computer executable instructions is then configured to perform the following steps:

1) Retrieve the surface data set from the computer readable memory device.
2) Identify data points (primary nodes) in the data set which define first and second portions of a boundary which defines a discontinuity in the surface, the boundaries being defined by triangle edges.
3) Segment the boundaries of the discontinuity into an equal number of segments.
4) Identify locations of segments along the triangle edges which comprise the first and second boundaries of the discontinuity.
5) Calculate a first value of the property for a first primary node on the first boundary of the discontinuity.
6) Calculate a second value of the property for a second primary node on the first boundary of the discontinuity.
7) Linearly interpolate a third value of the property at the location of a segment on the first boundary as a function of the distance of the segment from the first primary node, and as a function of the first and second values of the property at the respective first and second primary nodes. Here, the third value of the property at the location of the segment on the first boundary is assigned to the corresponding location of the segment on the second boundary.
8) Calculate a fourth value of the property at a third primary node on the second boundary as a function of the distance of the third primary node from the location of the segment on the second boundary and the third value of the property.

9) Store the modified data set which comprises the interpolated nodes and the calculated property values.

In this way values of a property to be mapped onto a surface can be determined to provide a continuity of the property across a discontinuity which is defined by the surface.

It will be appreciated that the steps described above of interpolating the values of the property and calculating their values can be accomplished by putting the various equations described above into the form of executable computer software. It will be further appreciated that the other steps described in the present detailed description of the invention can be included as part of the set of computer executable instructions to transform the initial surface data set to a modified data set which more accurately maps the associated properties onto the surface.

In like manner, a first aspect of the present invention comprises a method of establishing a continuity of a property which is interpolated over a surface. The method includes the step of identifying first and second portions of a boundary which defines a discontinuity in the surface, the surface being defined by at least two primary nodes. The method further includes defining the first and second portions of the boundary by at least one secondary node on each portion, and interpolating the property from a first primary node to a second primary node by utilizing the secondary nodes.

A second aspect of the present invention includes a method of modeling a value of a property across a discontinuity which is defined in a surface. The method comprises the steps of defining the surface and first and second portions of a boundary of the discontinuity by a plurality of primary nodes, and assigning a secondary node to each of the first and second portions of the boundary. The method also includes the step of interpolating the value of the property across the boundary from a first primary node to a second primary node while maintaining a predetermined continuity between the corresponding secondary nodes.

A third aspect of the present invention includes a method of establishing a continuity of a property which is interpolated over a surface. The method includes sequential steps as follows. First, identifying first and second portions of a boundary which defines a discontinuity in the surface, the surface defined by at least two primary nodes. Following identifying the first and second portions of the boundary, defining the first and second portions of the boundary by at least one secondary node on each portion. Following defining the first and second portions of the boundary by at least one secondary node on each portion, substantially simultaneously interpolating the property from a first primary node to a second primary node by utilizing the secondary nodes.

A fourth aspect of the present invention includes a method of calculating values for a property to be mapped onto a surface to provide a continuity of values of the property across a discontinuity which is defined by the surface. The method comprises the steps of topologically defining the surface by a plurality of primary nodes which are mathematically associated with one another to provide a plurality of triangles having apexes at the primary nodes and triangle edges connecting the primary nodes. The method further includes identifying first and second boundaries which define the discontinuity in the surface, the boundaries comprising triangle edges, and identifying selected primary nodes which are on the first and second boundaries of the discontinuity. Additionally, the method includes segmenting the boundaries of the discontinuity into an equal number of segments, and identifying locations of segments along the triangle edges which comprise the first and second boundaries of the discontinuity. The fourth aspect also includes the steps of calculating a first value of the property for a first primary node on the first boundary of the discontinuity, and calculating a second value of the property for a second primary node on the first boundary of the discontinuity. The method further includes linearly interpolating a third value of the property at the location of a segment on the first boundary as a function of the distance of the segment from the first primary node, and as a function of the first and second values of the property at the respective first and second primary nodes. In the fourth aspect, the third value of the property at the location of the segment on the first boundary is assigned to the corresponding location of the segment on the second boundary. A further step in the method includes calculating a fourth value of the property at a third primary node on the second boundary as a function of the distance of the third primary node from the location of the segment on the second boundary and the third value of the property.

Although the invention has been described in language more or less specific as to structural and methodical features, it is to be understood that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of establishing a continuity of a property which is interpolated over a surface, the surface being represented by a surface data set which comprises data values representative of nodes which collectively and spatially represent the surface, the method comprising:

retrieving the data set;

identifying data values within the data set which represent first and second portions of a boundary which defines a discontinuity in the surface, the surface defined by at least two of the nodes which are defined as first and second primary nodes;

defining the first and second portions of the boundary by secondary nodes by generating data values representative of at least one secondary node on each portion of the boundary;

interpolating the property from the first primary node to a second primary node by utilizing the secondary nodes to thereby create a modified data set representing continuity of the property over the discontinuity and in the surface; and at least one of storing or displaying the modified data set.

2. The method of claim 1, and wherein the step of interpolating the property from the first primary node to the second primary node comprises calculating a given value for the property at one of the first and second primary nodes, the given value being a function of its distance from at least one of the secondary nodes.

3. The method of claim 1, wherein the continuity of the property is established between a selected secondary node on the first portion of the boundary and a selected secondary node on the second portion of the boundary.

4. The method of claim 3, and wherein the property is characterized by determined values at primary nodes on the surface, and wherein the continuity of the property is established as substantially the same value of the property at the selected secondary nodes.

5. The method of claim 4, and wherein the surface is characterized by a given gradient at each of the secondary nodes, and wherein the continuity of the property is further established as substantially the same gradient at the selected secondary nodes.

6. The method of claim 1, and further comprising:
interpolating the property to the secondary nodes while interpolating the property from the first primary node to the second primary node.

7. The method of claim 1, and wherein the step of interpolating the property is performed in a manner such that it converges on the given values for the continuity of the property at the first and second primary nodes.

8. The method of claim 1, and further comprising:
identifying data values within the data set which represent a plurality of primary nodes which define the discontinuity; and
generating data values to represent the first and second portions of the boundary by at least as many secondary nodes as the number of primary nodes which define the discontinuity in the surface.

9. The method of claim 8, and wherein the number of secondary nodes used to define each portion of the boundary of the discontinuity is greater than the number of primary nodes which define the discontinuity.

10. The method of claim 9, and wherein the property is defined by a given value at selected primary nodes, and wherein the given value of the property at the primary nodes which define the discontinuity is determined as a function of the relative location of a secondary node to a primary node on the same portion of the boundary.

11. The method of claim 1, and wherein the step of defining the first and second portions of the boundary by secondary nodes is performed after the step of defining the first and second portions of the boundary, and before the step of interpolating the property.

12. The method of claim 1, and further comprising spatially linking the first and second portions of the boundary by the secondary nodes prior to interpolating the continuity of the property.

13. The method of claim 1, and wherein each secondary node defined for the first portion of the boundary has a corresponding secondary node defined for the second portion of the boundary.

14. The method of claim 13, and wherein the first and second portions of the boundary are each further defined by a plurality of primary nodes on the respective portions of the boundary.

15. The method of claim 14, and wherein the first and second portions of the boundary are further each defined by data values representative of respective first and second endpoints, and wherein the boundary primary nodes on each portion of the boundary include first and second endpoint primary nodes located at the respective endpoints of the boundary portions.

16. The method of claim 15, and wherein a distance between the first endpoint primary node and selected ones of the secondary nodes is determined for each portion of the boundary, and each secondary node on one portion of the boundary is defined to have the same value for the property at the corresponding secondary node on the other portion of the boundary.

17. The method of claim 16, and further comprising:
first calculating a first value for the property at the first and second endpoint primary nodes on the first portion of the boundary;
then calculating a second value for the property at a selected secondary node on the first portion of the boundary; and
assigning the calculated second value of the property for the selected secondary node on the first portion of the boundary to the corresponding secondary node on the second portion of the boundary.

18. The method of claim 17, and wherein calculating the second value for the property at the selected secondary node is performed as a function of the calculated first value for the property at the first and second endpoint primary nodes and the distance between the first endpoint primary node and the selected secondary node.

19. The method of claim 18, and further comprising calculating a third value for the property at one of the boundary primary nodes on the second portion of the boundary using the second value of the property assigned to the corresponding secondary node.

20. The method of claim 19, and wherein calculating the third value of the property at the boundary primary node on the second portion of the boundary is performed as a function of the distance between the corresponding secondary node and the boundary primary node on the second portion of the boundary.

21. The method of claim 20, and wherein the calculations of the first values of the property at the first and second endpoint primary nodes on the first portion of the boundary, and the calculations of the second value of the property at the selected secondary node on the first portion of the boundary, and the calculation of the third value of the property at the boundary primary node on the second portion of the boundary, are all performed in such a manner as to cause each of the values to converge substantially towards continuity of the property across the discontinuity in the surface.

22. The method of claim 20, and further comprising:
identifying data values in the data set to define a third primary node which is associated with an adjacent set of boundary primary nodes on the first portion of the boundary to define a first triangle having a boundary triangle edge lying along the first portion of the boundary, and wherein the selected secondary node lies on the boundary triangle edge of the first triangle;
calculating a first gradient function of the property for the first triangle; and
calculating a first gradient of the property at the selected secondary node using the first gradient function.

23. The method of claim 22, and further comprising:
identifying data values in the data set to define a fourth primary node which is associated with an adjacent set of boundary primary nodes on the second portion of the boundary to define a second triangle having a boundary triangle edge lying along the second portion of the boundary, and wherein the primary node corresponding with the selected secondary node lies on the boundary triangle edge of the second triangle;
calculating a second gradient function of the property for the second triangle; and
calculating a second gradient of the property at the corresponding secondary node by using the second gradient function.

24. The method of claim 23, and wherein the first and second triangles are defined by respective first and second local coordinate systems, and wherein the first gradient function and the second gradient function are functions of the respective local coordinate systems.

25. The method of claim 24, and wherein the calculations of the first and second gradient function, and the calculating of the first and second gradients of the property, are all performed in a manner to cause the first and second gradients of the property to substantially converge towards each other.

26. The method of claim 1, and wherein interpolating the value of the property across the boundary from a first primary node to a second primary node while is performed while maintaining a predetermined continuity between the corresponding secondary nodes.

27. The method of claim 26, and wherein the continuity between the secondary nodes is defined to be substantially the same value of the property at the corresponding secondary nodes.

28. The method of claim 26, and wherein the property is defined by a given gradient at each of the secondary nodes, and wherein the continuity between the secondary nodes is substantially the same gradient of the property at the corresponding secondary nodes.

29. The method of claim 26, and wherein the primary nodes topologically define the surface such that the surface comprises a plurality of discrete triangles having apexes at common primary nodes and adjacent triangle edges, and wherein the discontinuity is defined by terminal endpoints at the primary nodes.

30. The method of claim 29, and wherein the boundary of the discontinuity is defined by a plurality of triangle edges and primary nodes, the method further comprising:
assigning to each portion of the boundary a number of secondary nodes which is at least equal to the least number of primary nodes defining either portion of the boundary.

31. The method of claim 29, and further comprising:
assigning to each portion of the boundary a number of secondary nodes which is greater than the least number of primary nodes defining either portion of the boundary.

32. The method of claim 26, and wherein interpolating the property from a first primary node to a secondary primary node is performed for primary nodes which define triangles having edge sides on the first and second portions of the boundary of the discontinuity.

33. The method of claim 1, wherein interpolating the property from a first primary node to a second primary node by utilizing the secondary nodes is performed substantially simultaneously.

34. The method of claim 33, and further comprising:
while interpolating the property from the first primary node to the second primary node, interpolating the property to the secondary nodes.

35. A method of modifying a data set, the data set representing a surface topologically defined by a plurality of primary nodes which are mathematically associated with one another to thereby provide a plurality of triangles having apexes at the primary nodes and triangle edges connecting the primary nodes, the surface defining a discontinuity, the discontinuity being defined by first and second boundaries, the data set further comprising a representation of a property to be mapped onto the surface, the modifying of the data set being for the purpose of providing a continuity of values of the property across the discontinuity, the method comprising:

retrieving the data set;

identifying data values within the data set which represent primary nodes which, when spatially linked, define triangle edges which in turn represent at least a portion of the first and second boundaries;

segmenting at the triangle edges into an equal number of segments;

determining data values representative of the spatial locations of the segments along the triangle edges;

calculating a first value of the property for a first primary node on the first boundary of the discontinuity;

calculating a second value of the property for a second primary node on the first boundary of the discontinuity;

linearly interpolating a third value of the property at the location of a segment on the first boundary as a function of the distance of the segment from the first primary node, and the first and second values of the property at the respective first and second primary nodes;

assigning the third value of the property at the location of the segment on the first boundary to the corresponding location of the segment on the second boundary;

calculating a fourth value of the property at a third primary node on the second boundary as a function of the distance of the third primary node from the location of the segment on the second boundary and the third value of the property to thereby create a modified data set which provides for a continuity of values of the property across the discontinuity; and at least one of displaying or storing the data set.

* * * * *